United States Patent [19]

Detterbeck et al.

[11] Patent Number: 4,558,894
[45] Date of Patent: Dec. 17, 1985

[54] METHOD AND DEVICE FOR TYING A BUNDLE OF ELECTRICAL WIRES

[75] Inventors: Max Detterbeck, Nuremberg; Emil Dümmler, Schwaig, both of Fed. Rep. of Germany

[73] Assignee: Siemens Aktiengesellschaft, Munich, Fed. Rep. of Germany

[21] Appl. No.: 662,180

[22] Filed: Oct. 18, 1984

[30] Foreign Application Priority Data

Oct. 18, 1983 [DE] Fed. Rep. of Germany ....... 3337853

[51] Int. Cl.[4] ...................... H05K 13/06; B65H 69/04
[52] U.S. Cl. .................................. 289/1.5; 140/93 R; 289/2; 289/18.1
[58] Field of Search .......................... 289/1.5, 2, 18.1; 140/93 R, 93 A, 93.2

[56] References Cited

U.S. PATENT DOCUMENTS 3,252,723 5/1966 Burke .................................. 289/1.5
3,670,783 6/1972 Goodwill .......................... 140/93 R
3,700,010 10/1972 Bartilson et al. ................. 140/93 A
4,094,342 6/1978 Nishikawa et al. ................ 140/93.2

FOREIGN PATENT DOCUMENTS 2228162 1/1974 Fed. Rep. of Germany .
2533640 2/1977 Fed. Rep. of Germany .
2705418 9/1977 Fed. Rep. of Germany .

*Primary Examiner*—Louis K. Rimrodt
*Attorney, Agent, or Firm*—Kenyon & Kenyon

[57] ABSTRACT

In a device for automatically looping a thread about a bundle of wires to form a continuous crocheted tying structure, a camming mechanism is provided for limiting the tying cycles to two and for adding a plurality of knotting cycles. A cutting knife and an intercept needle are reciprocatably mounted to the housing of the device and are shifted by a pneumatic cylinder under control of the camming mechanism. The knife cuts the thread after the formation of a plurality of knot loops, while the intercept needle catches the thread and holds it for the next work operation.

13 Claims, 28 Drawing Figures

2×45°
2×90°
34
35
36
37
38
39
14
222
223
224
225
226
227
228
229
230
231
232
233
40
41
42
43
44
45
46
47
48
49
50
51
52
53
54
55
56

METHOD AND DEVICE FOR TYING A BUNDLE OF ELECTRICAL WIRES

BACKGROUND OF THE INVENTION

This invention relates to a method and device for tying a bundle of electrical wires.

In many areas of technology and industry it is customary to tie a plurality of electrical wires together, particularly where several wires are laid in parallel over extended distances such as in electrical equipment and aircraft. In electrical motors bundles of wires forming the windings of the rotor and stator are customarily bound up together. One known method of holding bundles of wires together involves the use of separate plastic ties or binders each of which operates independently of the others. The cable binders are prefabricated as individual plastic parts and are comparatively expensive.

German Offenlegungsschrift No. 2,533,640 discloses a method and device for continuously wrapping a bundle of wires by means of a lacing or crocheting process with tying yarn laid in loops. At the end of the tying process, in which the bundle of wires has been tied continuously along its length, the end of the thread is cut off manually and tied manually. The device described in Offenlegungsschrift No. 2,533,640 comprises a housing or frame in the form of a gun at one end of which is mounted a thread spool or reel. At an end of the gun opposite the thread reel, a substantially C-shaped protector or guard and a similarly shaped guide member are pivotably mounted for rotation about an axis extending substantially perpendicularly to the plane of the gun. The guard and the guide each have U-shaped opening in which the bundle of wires is inserted, the bundle extending parallel to the axis of rotation of the guard and the guide member upon insertion of the bundle into the U-shaped opening. A pneumatic cylinder is swingably mounted to the frame at a pivot pin at an end of the frame proximate to the thread reel and spaced from the guard and the guide member. The pneumatic cylinder has a plunger or reciprocatable shaft to the free end of which is attached a latch needle for forming a series of interlocking thread loops about the bundle of wires. The plunger of the pneumatic cylinder is provided with a pin or lug extending transversely from the plunger through a wishbone-shaped slot formed in one of the plates of the frame. Upon reciprocation of the latch needle and the plunger of the pneumatic cylinder, the pin or lug moves first along one arm of the wishbone-shaped slot and then along the other arm thereof, whereby the latch needle is shifted from one side of the U-shaped opening to the other side thereof in alternating phases of a tying cycle. The pin also traverses a radially extending slot in a gear which has teeth meshing with teeth formed on an outer edge of the C-shaped guard. Upon reciprocation of the latch needle and the plunger of the pneumatic cylinder and upon the sliding motion of the pin along the arms of the wishbone-shaped slot, the gear rotates and thereby pivots the guard and the guide member about the axis along which a bundle of wires is disposed. The tying device disclosed by Offenlegungsschrift No. 2,533,640 includes an assembly for automatically varying the pressurization of the pneumatic cylinder to reciprocate the plunger and the latch needle. A trigger is provided on the device for controlling the initiation of the automatic tying operation.

In the device of German Offenlegungsscrift No. 2,533,640 it is not possible to achieve a fully automatic operation in that both the initial attachment of the yarn to the bundle of wires and the severing and knotting of the yarn at the end of the tying operation must be accomplished manually. This peculiarity of the device is considered a disadvantage by the technical community since it results in practice in a time consuming and inefficient operation.

An object of the present invention is to provide an improved device for tying a bundle of wires, which is completely suitable for one-handed operation and which decreases, if not eliminates, the extent to which manual operations are necessary.

Another object of the present invention is to provide an improved method for tying a bundle of wires, which method is fully automatic.

SUMMARY OF THE INVENTION

A known method for tying a bundle of electrical wires comprises the steps of (a) pulling a thread or yarn from a supply reel, (b) holding a leading portion of the thread proximate to the bundle of wires in a plane oriented substantially transversely to the longitudinal axis of the bundle and (c) automatically pulling the thread at an intermediate point thereof in a first direction about the axis to form one loop of the thread, this last step being executed on a first side of the bundle of wires. The method further comprises the steps of (d) continuing to automatically move the one loop of thread in the first direction about the bundle of wires while automatically pulling a remaining portion of the thread about the bundle in a second direction opposite the first direction. In another step (e), the remaining portion of the thread is automatically pulled at an intermediate point thereof in the second direction through the one loop on a second side of the bundle substantially opposite the first side to form another loop of the thread. In yet another step (f) of the tying process, one continues to move the other loop in the second direction about the bundle while pulling the remaining portion of the thread in the first direction about the bundle. The steps of pulling the thread in opposite directions in loops about the bundle of wires to form a series of interlocking thread loops (steps (c) through (f)) is then repeated along the length of the bundle of wires.

In a method in accordance with the present invention, the continued repetition of the pulling and looping steps is automatically terminated upon the completion of a preselected number of repetitions. Upon this termination, a plurality of additional loops of the thread is laid in a chain-like formation on one side of the bundle of wires, thereby forming a knot in the thread. Upon reformation of the knot, the thread is automatically cut at the knot, whereby a new leading end portion of the thread is formed. The new leading end portion is automatically gripped and held, whereby this end portion is available for a subsequent tying operation.

In accordance with further features of the present invention, the looping process is repeated once, so that the bundle of wires is tied twice by the thread, while at least two further loops are laid for forming the knot. The formation of the knot is completed by pulling the additional loops together. Preferably, the tying, knotting, cutting-off and gripping steps form a closed operating cycle.

A device for tying a bundle of electrical wires comprises a housing, a thread supply wheel mounted to the housing, a horseshoe- or C-shaped guide member with a U-shaped opening pivotable about the bundle of wires upon placement thereof in the opening, and a loop-forming mechanism including a latch needle mounted to the housing for forming interlocking loops of thread and the bundle. A first shifting mechanism on the housing is operatively connected to the latch needle for swinging the needle about a pivot point so that the needle is located on substantially opposite sides of the member in alternating phases of an operating cycle. A second shifting mechanism on the housing is operatively linked to the latch needle for shifting the same in a longitudinal direction (i.e., relative to the length of the latch needle) in the alternating phases of the operating cycle. A third shifting mechanism on the housing is operatively coupled to the needle and to the guide member for rotating the guide member about the bundle of wires in conjunction with the pivoting of the latch needle by the first shifting mechanism.

In accordance with the present invention, a cutting knife is movably mounted to the housing, while a fourth shifting mechanism on the housing is operatively linked to the knife for shifting the knife in a direction substantially parallel to the orientation of the latch needle in an extended state thereof on one side of the bundle of wires. A gripper including an intercept needle is movably mounted to the housing for grasping and holding the thread upon a severing thereof after a knotting operation. The fourth shifting mechanism is operatively linked to the gripper for shifting the intercept needle substantially simultaneously with the shifting of the knife.

In accordance with another feature of the present invention, the wire wrapping or tying device further comprises a programmer operatively coupled to the loop-formimg mechanism and to the first shifting mechanism for controlling the operation of the loop former and the first shifter mechanism to limit a tying cycle to a first predetermined plurality of repetitions and to induce the execution by the loop-forming mechanism of a second predetermined plurality of knotting cycles. The programmer preferably includes at least one cam in the form of a wheel.

In accordance with yet another feature of the present invention the first shifting means includes a wishbone-shaped slot in a plate fastened to the housing and a pin projecting from the latch needle through the slot. The slot has a pair of elongate extensions or arms, while the programmer includes a finger member shiftable into proximity with the slot for preventing the pin from moving along one of the extensions of the slot upon the completion of the first predetermined plurality of repetitions of the tying cycle and for thereby inducing the execution of the second predetermined plurality of knotting cycles by the loop-forming mechanism.

In accordance with another feature of the present invention, the programmer cooperates with the fourth shifting mechanism for inducing the operation thereof upon the completion of the predetermined plurality of knotting cycles.

The second shifting means advantageously includes a first pneumatic cylinder and the fourth shifting means advantageously includes a second pneumatic cylinder, the programmer being operatively linked to the cylinders for controlling the actuation thereof at respective preselected times in a complete operating sequence of the tying device. The programmer includes a time delay device for ensuring a precise separation between (a) tying and knotting operations performed by the loop-forming mechanism and (b) cutting and thread-holding operations performed by the knife and the gripper. The time delay device preferably takes the form of an air damper operatively linked to a piston of the second pneumatic cylinder.

A tying device in accordance with the present invention can be held in one hand like a gun during the entire operating sequence. The device enables the execution of a tying operation at discrete points along the length of a bundle of wires, rather than continuously along the length of the bundles. With the continuous crocheting process of the prior art, it was necessary to move the tying device along the length of the bundle of wires at a uniform velocity. With the device of the present invention, wherein tying takes place at a series of discrete points along the wire bundle, a substantially greater range of uses is possible.

With the prior art device of Offenlegungsschrift No. 2,533,640 a continuous crocheted structure is created which can be destroyed over the entire length of a bundle of wires if the thread is severed at any one point. In contrast, a multiplicity of discrete wire ties can be formed in accordance with the present invention along the length of a bundle of wires. The severing or destruction of one tie has no effect on the other ties. In accordance with the present invention, the tying, knotting, cutting and capturing of the thread advantageously form a single closed operating cycle. Upon the completion of a double looping process and a subsequent double knotting process, the thread end is pulled through the knot structure for interception or capture after the cutting of the thread.

In a device in accordance with the present invention the latch needle, the cutting knife and the intercept needle are operated in a timed sequence. The drives for the latch needle, on the one hand, and the cutting knife and the intercept needle, on the other hand, are preferably pneumatic, while the control design is mechanical. However, it is also possible to implement the drives as solenoids with the programmer taking the form of an electronic circuit such as a microprocessor.

DETAILED DESCRIPTION

In a device and method in accordance with the present invention there is a tying process, a knotting process, a thread-cutting process and a thread-capturing process. The tying process is known from Offenlegungsschrift No. 2,533,640 and, accordingly, is described only partially hereinafter.

Figure 1:
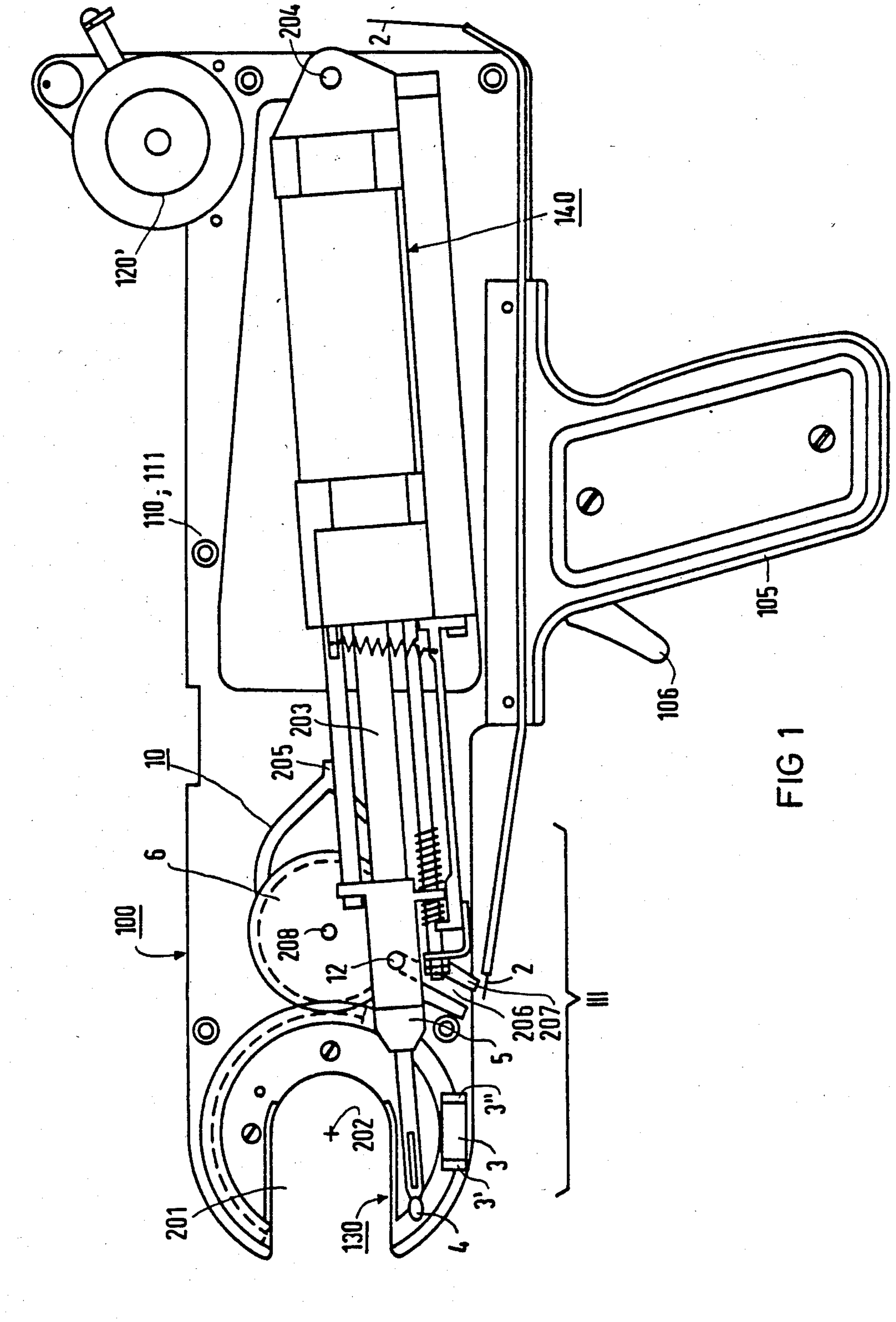
FIG. 1 is a schematic side view, partially broken away, of a tying device in accordance with the present invention, showing a reciprocatable latch needle and a horseshoe-shaped thread guide.
Figure 2:
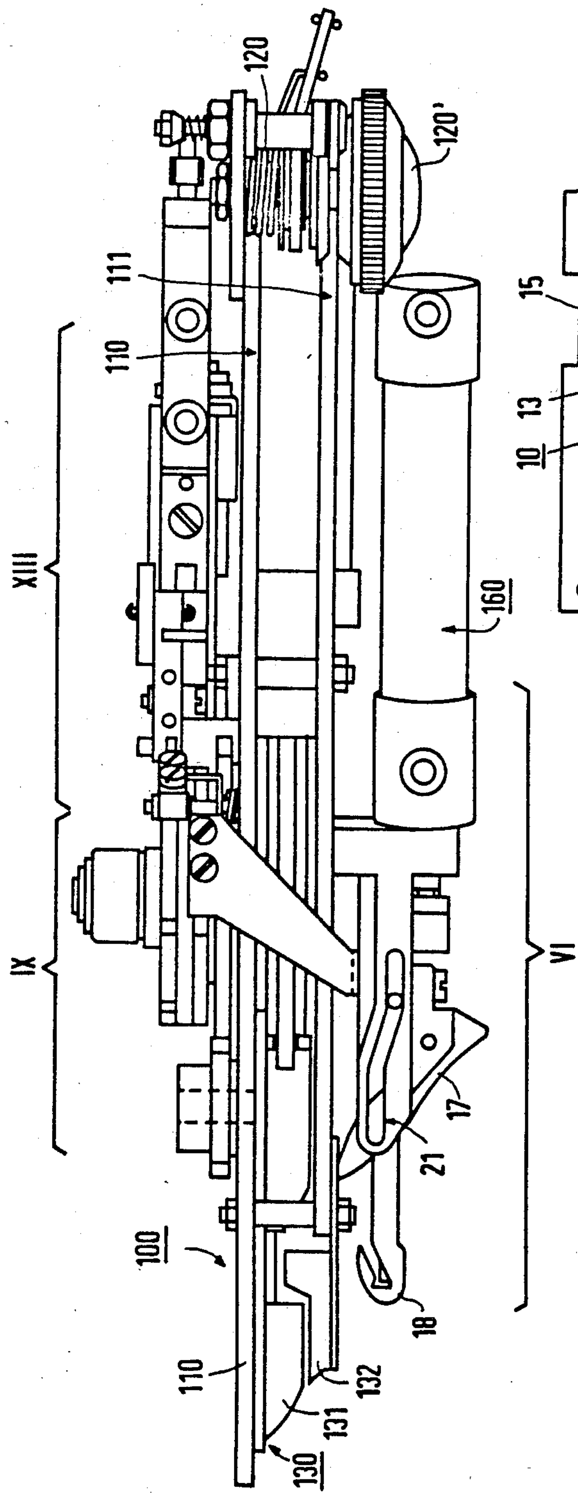
FIG. 2 is a schematic top view of the device of FIG. 1, showing a cutting knife, a thread intercept needle, a control cam assembly and a pressurization control assembly in accordance with the present invention.

As illustrated in FIGS. 1 and 2, a device for tying a bundle of parallel wires comprises a housing 100 provided with a handle or grip 105, whereby the tying or wrapping devlce is held by the user and whereby the device takes the form of a gun. The gun is provided at an upper portion of handle 105 with a trigger lever 106, the pivoting of which initiates operation of the device. The entire wrapping gun has a compact structure so that the gun may be brought into an operating position without difficulty even under cramped operating conditions. It is possible to guide the wrapping gun along a cable bundle by hand or by machine, in particular, by a robot.

Housing 100 of the wrapping gun comprises a pair of parallel plates 110 and 111 connected to and spaced from one another. At the rear end of the housing plates 110 and 111, a not shown supply reel for storing thread or yarn can be mounted. A thread 2 extends through guide slots in the housing 100 of the device to the operating area at the front end of housing 100. A thread tensioning and return device with a spring 120 and a adjustable knurling tool 120′ ensures that proper tension is maintained in the thread.

The operating area at the front of the wrapping gun has a horseshoe- or C-shaped thread guide or gripper 130 which carries a guide plate 3 having a pair of end flanges 3′ and 3″ extending perpendicularly to the plane of guide member 130. End flanges 3′ and 3″ are provided with apertures traversed by thread 2 during operation of the wrapping gun.

Gripper or guide member 130 is provided with a U-shaped opening 101 which is traversed by a bundle of wires 1 (see FIG. 3) during operation of the wrapping gun. Guide 130 is provided on a circular outer edge with teeth meshing with the teeth of a drive gear 6, whereby guide member 130 can be swung about an axis 202 to implement the looping of thread 2 about a bundle of wires.

A latch needle 4 provided with a pivotably mounted latch 9 (see FIGS. 3*f*–3*j*) is attached to the end of a plunger 203 of a pneumatic cylinder 140 by means of a holder 5. As described in Offenlegungsschrift No. 2,533,640, pneumatic cylinder 140 is provided with a valve assembly whereby a pair of pressure chambers separated by a piston of the pneumatic cylinder are alternately pressurized to cause plunger 203, holder 5 and latch needle 4 to reciprocate in a longitudinal direction, i.e., parallel to the elongate dimension of these components. Pneumatic cylinder 140 is swingably mounted between plates 110 and 111 at a pivot pin 204. During a tying process, as described in the Offenlegungsschrift, a pin or lug 12 rigid with holder 5 and projecting laterally therefrom moves along a generally wishbone-shaped guide slot 10 preferably formed in a guide plate 11 (see FIG. 4) attached to housing plates 110 and 111. Slot 10 and pin 12 cooperate in the manner of a camming mechanism to pivot pneumatic cylinder 140 (as well as plunger 203 and latch needle 4) about pivot pin 204 during the reciprocation of plunger 203.

In a fully extended state of latch needle 4 and plunger 203 from pneumatic cylinder 140, the latch needle 4 is disposed either below axis 202, as illustrated in FIG. 1, or above axis 202 in a position mirroring the configuration shown in FIG. 1. In a fully retracted state of plunger 203, pin 12 is located at a nub 205 of wishbone-shaped guide slot 10, while latch needle 4 lies in a common plane with axis 202. As described in Offenlegungsschrift No. 2,533,640, pin 12 also traverses a slot 206 extending centrally along the length of a radial arm 207 attached to gear 6. Upon the reciprocation of latch needle 4 and the concomitant rotation thereof about pivot pin 204, gear 6 rotates about an axis 208 extending parallel to axis 202. The rotation of gear 6 causes the rotation of horseshoe-shaped guide member 130, owing to the intermeshing of the teeth thereof.

During a tying process, as described in Offenlegungsschrift No. 2,533,640, the hook of latch needle 4 catches the thread 2 at the distal end of housing 100 and pulls the thread 2 towards the other end of the housing, i.e., towards pivot pin 204, through a previously formed loop in the thread, thereby forming an interlocking pair of loops. Successive loops are formed, in alternating phases of a tying cycle, above and below the bundle of wires (relative to the orientation of the tying gun shown in FIG. 1) and are drawn by the latch needle around the periphery of the bundle of wires, owing to the swinging motion of the latch needle about pivot pin 204.

In the motion of latch needle 4 it is important that thread 2 is guided in the operating area in a predetermined manner. For this purpose, suitable guide baffles 131 and 132 are mounted to the housing plates 110 and 111 in the vicinity of gripper 130.

As illustrated in FIG. 2, a tying gun in accordance with the present invention has additional operating devices attached to the outside surfaces of plate 110 and 111. A cutting knife 17 and a so-called intercept needle 18 are movably attached to the outside of plate 111 for executing a generally forward/backward reciprocating motion in response to the pressurization of a pneumatic cylinder 160 connected to plate 111. The motion of cutting knife 17 and intercept needle 18 is also directed inwardly toward housing plate 110 during an extension stroke of the plunger of pneumatic cylinder 160. This inward movement is caused by means of a guide slot 21, as described in detail hereinafter.

Cutting knife 17 and intercept needle 18, together with associated operating and control mechanisms, enable a complete automation of the looping process including the tying and severing of the thread 2, so that the tying of a bundle of wires may be easily accomplished at discrete points along the length of the bundle. Advantageously, the tying is limited to two loops about the bundle. This limitation reduces the amount of work and the amount of material required to achieve a satisfactory securing of a wire bundle.

FIGS. 3*a*–3*e* illustrate successive stages in a two cycle knotting process in which two knotting loops are produced in a chain-like configuration from the final loop of the tying process.

Figure 3A:
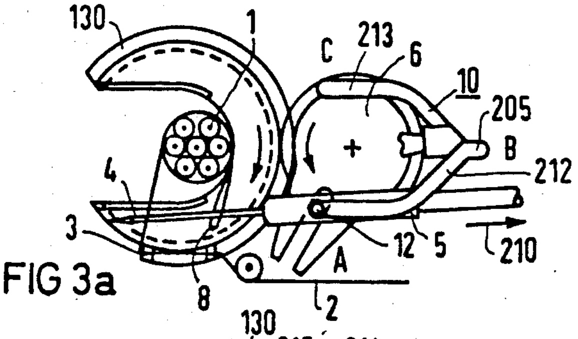
FIGS. 3*a*–3*e* are schematic side views of the latch needle and horse-shaped thread guide of FIG. 1, corresponding to the bracketed region III therein, showing successive operating phases in a knotting process.
Figure 3F:
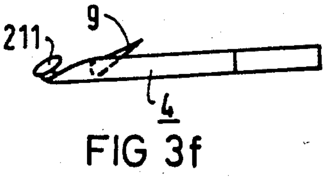
FIGS. 3*f*–3*j* are enlarged partial side views of the latch needle of FIGS. 1 and 3*a*–3*e*, showing the orientations of a needle latch corresponding to the positions of the needle in FIGS. 3*a*–3*e*, respectively.

Upon the completion of a tying process, thread 2 and latch needle 4 have the configurations shown in FIG. 3*a*, while latch 9 of latch needle 4 is disposed in the orientation illustrated in FIG. 3*f*. A change in the pressurization of the chambers inside pneumatic cylinder 140 causes plunger 203, holder 5 and needle 4 to move towards pivot pin 204 (see FIG. 1), as indicated by an arrow 210. A hook 211 (FIG. 3*f*) catches thread 2 at a portion thereof extending from guide plate 3 tangentially to bundle 1 and draws that portion of thread 2 through a previously formed loop 8. During the retraction stroke of plunger 203, pin 12 moves along a lower arm or extension 212 of wishbone-shaped slot 10 and causes gear 6 to rotate about axis 208, which rotation in turn causes guide member 130 to pivot about axis 202.

Figure 3B:
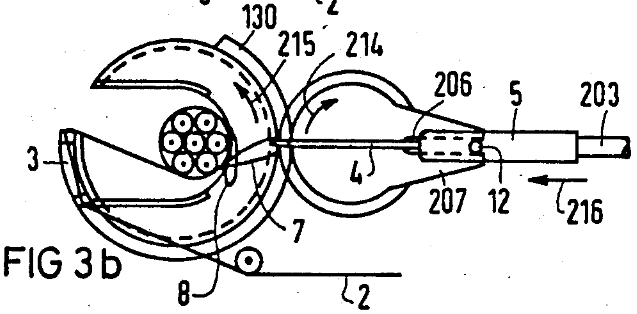
Figure 3G:
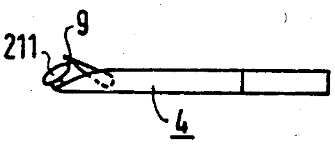

Upon the attainment by plunger 203 of its fully retracted position, illustrated in FIG. 3*b*, pin 12 is located at nub 205 of guide slot 10, while latch needle 4 intersects axis 208 and guide member 130 is disposed in an orientation angularly displaced from the orientation of FIG. 3*a* by 45°. As described in detail hereinafter, pin 12 is prevented by finger member 14 (FIG. 4) from entering an upper arm or extension 213 of wishbone-shaped guide slot 10, whereby pin 12 moves back down along arm 212 of the guide slot upon the subsequent extension stroke of plunger 203. With the extending motion of plunger 203 in the direction of an arrow 216, gear 6 and guide member 130 rotate in the directions indicated by arrows 214 and 215 in FIG. 3*b*, respectively, while needle 4 slides through a loop 7 newly formed in a chain-like arrangement with previously formed loop 8.

Figure 3C:
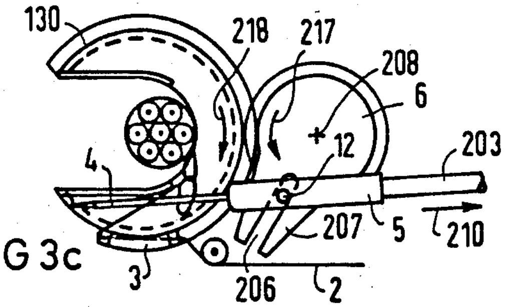
Figure 3H:
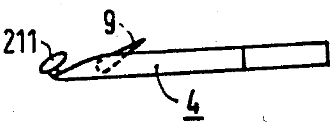
Figure 3D:
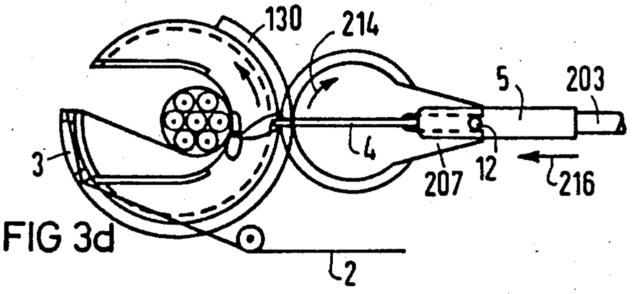
Figure 3I:
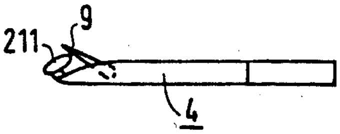
Figure 3E:
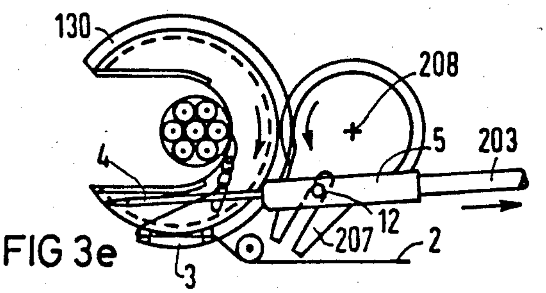
Figure 3J:
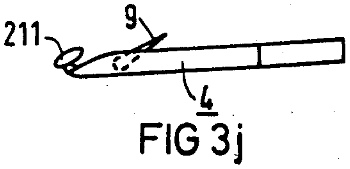

Upon the complete extension of plunger 203, latch needle 4, gear 6, guide member 130 and thread 2 assume the configuration illustrated in FIG. 3*c*. A subsequent retraction stroke of the plunger in the direction of arrow 210 causes the cylinder to pivot about pin 204 and further causes gear 6 and guide member 130 to rotate in the directions indicated by arrows 217 and 218, respectively. This motion constitutes a phase of a knotting cycle ending with the configuration illustrated in FIG. 3*d*. The second and final phase of the knotting cycle is defined by the motion of the latch needle 4 from the position shown in FIG. 3*d* to the configuration shown in FIG. 3*e*.

As illustrated in FIGS. 3*f*–3*j*, the latch 9 of latch needle 4 opens during an extension stroke of plunger 203 and closes during a retraction stroke thereof. The pivoting of latch 9 is achievable by the thread pressure with an appropriate design of latch needle 4.

Figure 4:
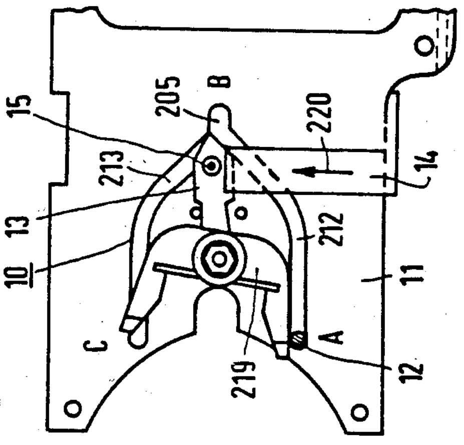
FIG. 4 is a side elevational view of an assembly, including a wishbone-shaped guide slot and an adjusting member or finger, for inducing the swinging of the latch needle about a pivot point durlng the tying and knotting processes.

FIG. 4 shows in detail the wishbone-shaped guide slot 10 and associated control members including a switching latch 13, finger member or latching lever 14 and a pin 15 projecting laterally from latch 13 and engageable by a free end of finger 14. As described in Offenlegungsschrift No. 2,533,640, switching latch 13 is resiliently connected to a winged lever member 219 for ensuring that pin 12 moves down one arm or extension 212 or 213 of slot 10 after moving up the other arm to nub 205. Thus, during one cycle of the tying process, pin 12 moves from point A to point B and from there to point C and subsequently from point C back to point B and then to point A. During a knotting process, finger 14 is shifted in the direction of an arrow 220 to engage pin 15 and to thereby push switching latch 13 into the path of guide slot arm 213 in the region of nub 205. In this way pin 12 is prevented from moving down guide slot arm 213 during a knotting process and is constrained to move between points A and B along guide slot arm 212.

Upon the formation of a plurality of knot loops, thread 2 must be pulled tight and severed at a defined position where it can be ensured that the severed thread can be caught and held and thus be immediately available for a subsequent tying process. The kinematics of the severing and catching or intercepting of the thread end is described hereinafter in various operating phases with respect to FIGS. 5*a*, 5*b*, 6*a*, 6*b*, 7*a*, 7*b*, 8*a* and 8*b*.

Figure 5A:
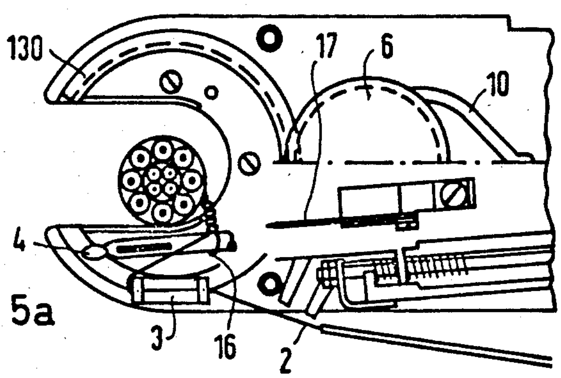
FIGS. 5*a* and 5*b* are schematic side views, partially broken away, of a forward portion of the tying device of FIGS. 1 and 2, showing different phases of the thread cutting process.
Figure 5B:
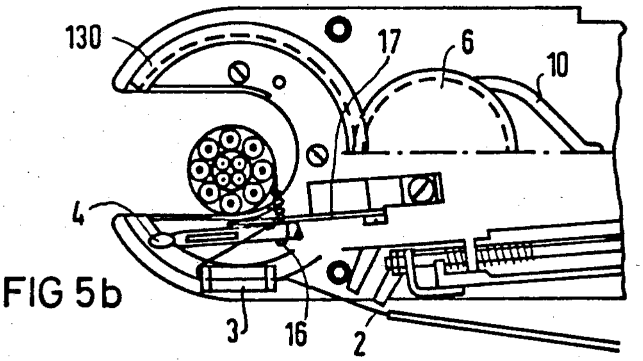
Figure 6A:
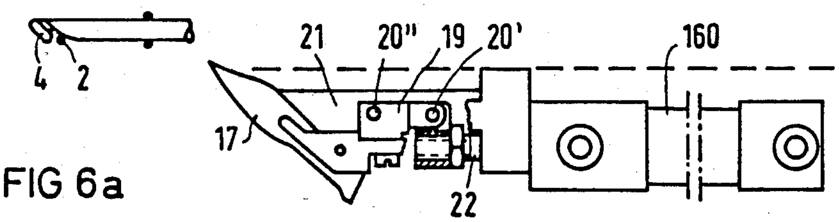
FIGS. 6*a* and 6*b* are schematic, partially cross-sectional side views, on an enlarged scale, of the latch needle and cutting knife in bracketed area VI in FIG. 2, showing successive cutting phases corresponding to those illustrated in FIGS. 5*a* and 5*b*, respectively.
Figure 6B:
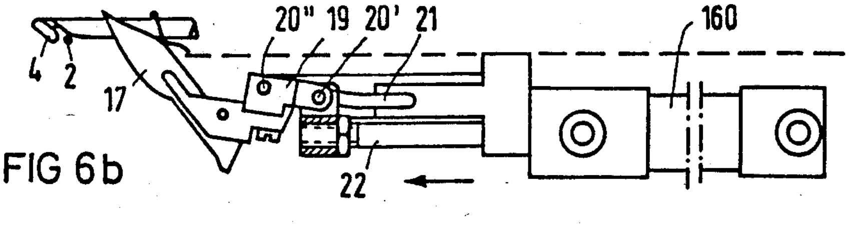

Upon the termination of a tying process, thread 2, latch needle 4, gear 6, cutting knife 17 and guide member 130 assume the configuration illustrated in FIG. 5*a*. Latch needle 4 traverses a loop 16 formed at the end of a chain of interlocking loops. Cutting knife 17 and intercept needle 18 are in the retracted or neutral positions shown in FIGS. 5*a*, 6*a* and 7*a*, 8*a*, respectively. Cutting knife 17 and intercept needle 18 are both attached to a plunger 22 of pneumatic cylinder 160 via a mounting or holder 19 and execute their motions in conjunction with one another. Holder 19 is swingably secured to plunger or shaft 22 by means of a pivot pin 20'. A peg or lug 20" rigid with holder 19 projects therefrom and traverses guide slot 21. The camming cooperation of peg 20" and guide slot 21 causes cutting knife 17 and holder 19 to pivot about pin 20' during an extension or a retraction stroke of plunger 22. The pivoting of knife 17 about pin 20' during an extension stroke shifts the knife into the plane of latch needle 4, whereby thread 2 is cut off immediately at knot 16. It is advantageous at this juncture to pull the free end of the thread backwards through the knot structure 16, which pulling simplifies the catching of the thread end.

The catching of the thread end is implemented by intercept needle 18, as illustrated in FIGS. 7*a*, 7*b*, 8*a* and 8*b*. Intercept needle 18 is part of an operating assembly including an internal slidably mounted clamping pin 23 rigid with an angle piece 24 in turn engaged by an internally disposed helical spring 25 and resiliently supporting an externally disposed pin member 27. Spring 25 is a compression spring functioning to push clamping pin 23 toward the needle opening 26 of intercept needle 18. An external spring 27' engaging pin 27 likewise serves to bias clamping pin 23 in the direction of needle opening 26.

Figure 7A:
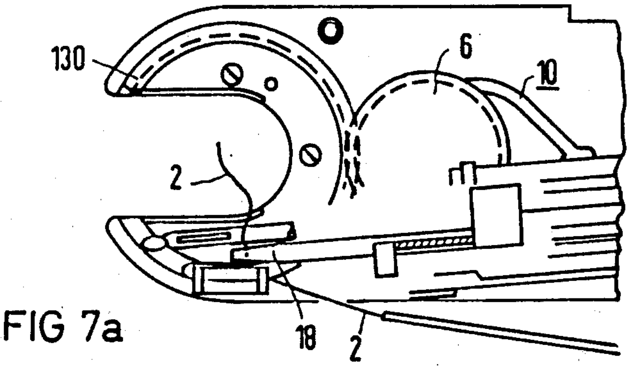
FIGS. 7*a* and 7*b* are schematic, partially cross-sectional side views similar to FIGS. 5*a* and 5*b*, showing different phases of a thread-intercepting process.
Figure 7B:
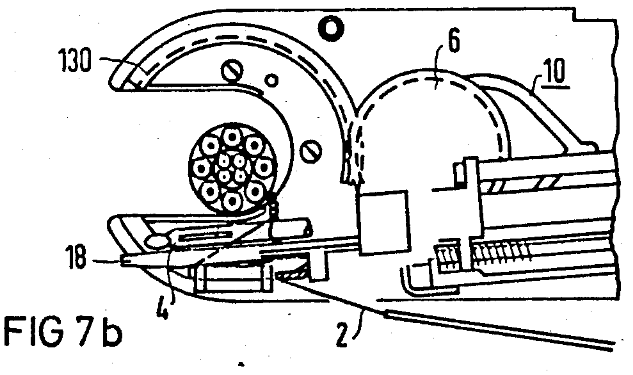
Figure 8A:
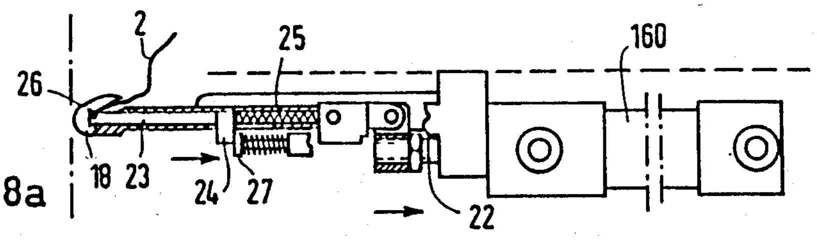
FIGS. 8*a* and 8*b* are schematic, partially cross-sectional side views, on an enlarged scale, of a thread-intercept needle in the bracketed area VI in FIG. 2, showing successive thread-catching phases corresponding to those operating phases illustrated in FIGS. 7*a* and 7*b*, respectively.
Figure 8B:
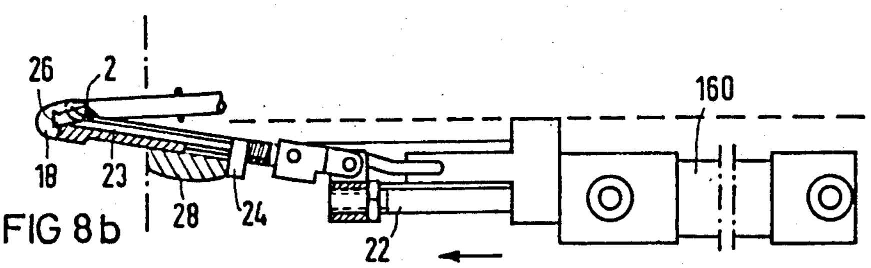

Upon a forward motion of intercept needle 18 from the rest or neutral position shown in FIGS. 7*a* and 8*a*, angle member 24 engages an arrest 28, whereby further forward motion of clamping pin 23 is prevented. The consequent withdrawal of clamping pin 23 from needle opening 26 enables thread 2 to be positioned therein. Upon a subsequent withdrawal of the intercept needle 18 from the extended position shown in FIGS. 7*b* and 8*b*, angle piece 24 is disengaged from arrest 28 and the forward end of clamping pin 23 enters needle opening 26 and clamps the free end of thread 2.

Cutting knife 17 and intercept needle 18 cofunction to implement the thread cutting and knotting operations. The interaction of the knife and the intercept needle also render it unnecessary to hold the thread at the beginning of a tying operation, as was necessary in prior art devices. Thus, the possibility of fully automatic operation is achieved for the first time.

Figure 9:
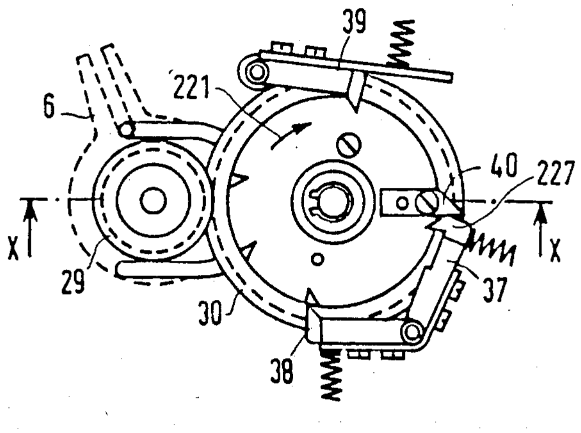
FIG. 9 is a side view of the control cam assembly in bracketed region IX of FIG. 1.

FIGS. 9, 10, 11*a*, 11*b* and 11*c* illustrate a cam control assembly which functions in part to restrict the number of tying cycles to two, the number of knotting cycles to two and to synchronize the actuation of pneumatic cylinder 160 with the actuation of pneumatic cylinder 140. As illustrated in FIG. 9, gear 6 is fastened to a drive gear 29 which has external teeth meshing with the teeth of an associated control gear 30. Control gear 30 is rotatably mounted to a stationary axle or shaft 31 rigid with mounting baffle or plate 11 (see FIG. 4). Three circular control cams 34, 35 and 36 are mounted to shaft 31 by means of a bushing 33 and a free-wheeling device 32 which serves to permit rotation of the control cams only in the direction of arrow 221 in FIG. 9. The gear ratio between gears 29 and 30 is chosen so that control cams 34, 35 and 36 are rotated through exactly 360° during the execution of two tying cycles, two knotting cycles and a cutting and thread-catching operation.

Figures 11A, 11B, 11C, 12, 13:
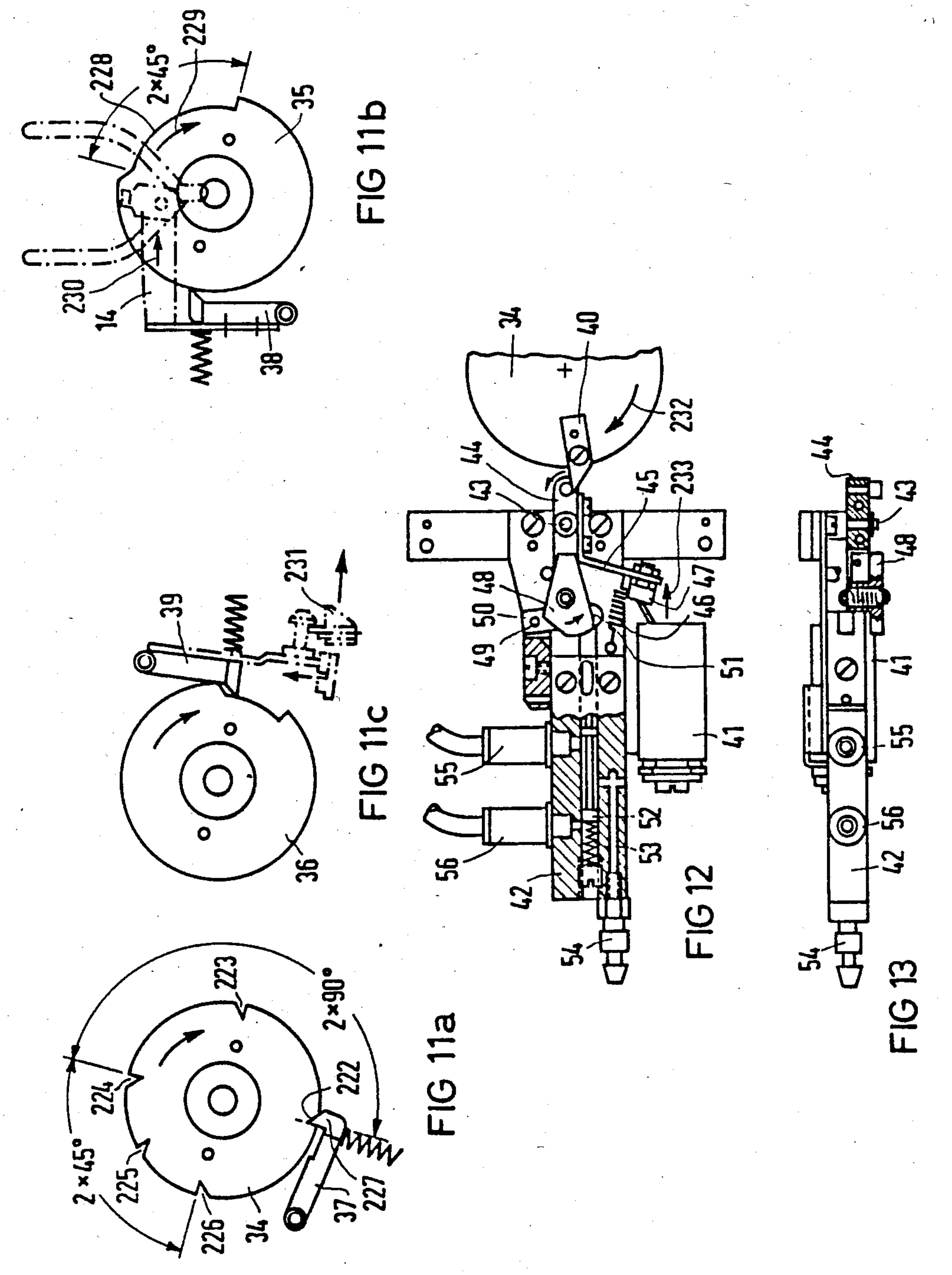
FIGS. 11*a*–11*c* are side elevational views of individual cams in the control cam assembly of FIGS. 2, 9 and 10.
FIG. 12 is a side view, partially in cross-section, of the pressurization control assembly of FIG. 2, corresponding to bracketed region XII in that figure.
FIG. 13 is a partial top view of the pressurization control assembly illustrated in FIG. 12 in bracketed region XIII thereof.

As illustrated in FIG. 11*a*, control cam 34 is formed at its circumference with five sawtooth-shaped notches 222–226. Notch pairs 222, 223 and 223, 224 each subtend an angle of 90° and correspond to respective cycles of a tying process. Notch pairs 224, 225 and 225, 226 each subtend an angle of 45° and correspond to respective cycles of a knotting process. A spring-loaded ratchet 37 pivotably mounted to housing 100 has at a free end a sawtooth-shaped projection 227 which rides along the circular outer surface of control cam 34 and which has substantially the same shape and size as notches 222–226, whereby the ratchet can snap into the notches. Ratchet 37 serves to exactly fix control cams 34, 35, 36 and thereby prevent gear 6 from being turned back during a change of direction. The orientation of control cam 34 in FIG. 11*a* represents a rest position of the control cam.

Control cam 35 cooperates with a spring-loaded ratchet 38 for controlling the disposition of finger 14, this finger member being rigid with the ratchet 38. Control cam 35 is a generally circular disk provided at its periphery with an elongate recess or indentation 228 which subtends an angle of 90° and corresponds to the two cycles of a knotting process in accordance with the present invention. Upon rotation of control cam 35 from the rest or neutral position illustrated in FIG. 11*b*, the leading edge of recess 228 arrives at the position of ratchet 38 after the completion of two tying cycles, i.e., after pin 12 twice negotiates the path from point A through point B to point C and back again (see FIG. 4). Upon the entry of the free end of ratchet 38 into recess 228, finger 14 is shifted in the direction of arrow 230.

Control cam 36 cooperates with a ratchet 39 for setting down the tying device. Ratchet 39 can block a reversing slider 231 and thereby arrest the operation of the device.

Figure 10:
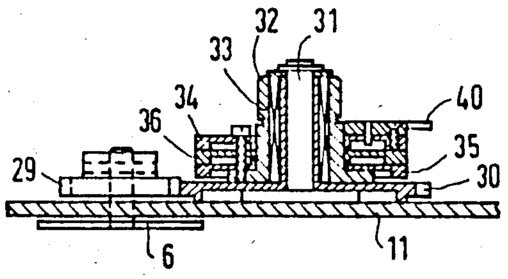
FIG. 10 is a cross-sectional view taken along line X—X in FIG. 9.

As illustrated in FIGS. 9 and 10 control cam 34 carries a cam lever or projection 40 which serves to trigger a separate control for the cutting and thread-catching process, if the tying gun is shut down. Control cam 34 and camming lever 40 cooperate with a pressurization control assembly illustrated in FIGS. 12 and 13. The pressurization control assembly comprises a time-delay air damper 41, a control valve 42, a pin 43 with a lever 44 pivotably supported thereon, a further control arm 45, a tension spring 46 and a joint 47 with a control ratchet resiliently supported on lever 44. The pressurization control assembly further includes a lever 50 pivotably mounted at point 49, a control cam 51. Control valve 42 comprises a piston 52, a compression spring 53 and compressed-air connections 54–56. These components form a functional unit. Upon the motion of control cam 34 and camming projection 40 in the direction of arrow 232, control ratchet 44 is moved downward and air damper 41 is actuated in the direction of an arrow 233. After cam projection 40 has passed lever 44, control ratchet 48 moves upwardly with a delay due to air damper 41 and shifts, via lever 50, control piston 52 to the left against compression spring 53. In the process, compressed air is directed to connection 56 from connection 54, connection 56 being coupled to pneumatic cylinder 106. In this manner the forward motion of cutting knife 17 and intercept needle 18 is initiated. If ratchet 48 runs over dog 51, control piston 52 moves to the right under the force exerted by compression spring 53. Compressed air is then directed to connection or hose 55 which is also connected to pneumatic cylinder 22 for causing the retraction stroke of knife 17 and intercept needle 18.

Upon the completed withdrawal of knife 17 and intercept needle 18, a work cycle consisting of a tying process, a knotting process, a severing and a catching of the severed thread is completed. The device is then ready for another operation.

In an apparatus in accordance with the present invention, the tying, knotting, severing and catching processes are carried out in individual steps which are synchronized exactly with one another. The tying and knotting operation, on the one hand, and the cutting and intercepting operation, on the other hand, always work in the same sense and are distinctly separated from each other.

Although the invention has been described in terms of specific embodiments and applications, persons skilled in the art, in light of this teaching, can generate additional embodiments without exceeding the scope or departing from the spirit of the claimed invention. For example, although the control assembly described above is mechanically controlled and pneumatically operated, it is also possible to provide an electric drive controlled by an electronic circuit, in particular, by a microprocessor. Accordingly, it is to be understood that the drawings and descriptions in this disolosure are proffered to facilitate comprehension of the invention and should not be construed to limit the scope thereof.

What is claimed is:

1. In a method for tying a bundle of electrical wires comprising the steps of (a) pulling a thread from a reel or the like, (b) holding a leading portion of the thread proximate to the bundle of wires in a plane oriented substantially transversely to a longitudinal axis of said bundle, (c) automatically pulling said thread at an intermediate point thereof in a first direction about said axis to form one loop, step (c) being executed on a first side of said bundle, (d) continuing to automatically move said one loop in said first direction while automatically pulling a remaining portion of said thread about said bundle in a second direction opposite said first direction, (e) automatically pulling said remaining portion of said thread at intermediate point thereof in said second direction through said one loop on a second side of said bundle substantially opposite said first side to form another loop, (f) continuing to move said other loop in said second direction about said bundle while pulling the remaining portion of said thread in said first direction about said bundle, and (g) repeating steps (c) through (f) along the length of said bundle, the improvement comprising the steps of:

(h) automatically terminating the continued repetition of steps (c) through (f) upon the completion of a preselected number of repetitions;

(i) automatically laying, in a chain-like formation, a plurality of additional loops of the thread on one side of the bundle of wires, thereby forming a knot in said thread;

(j) automatically cutting said thread at said knot, thereby forming a new leading end of the thread extending from the reel; and (k) automatically gripping and holding said new leading end, whereby said new leading end of the thread is available for a subsequent tying operation.

2. The improvement defined in claim 1 wherein steps (c) through (f) are repeated once, whereby said bundle is tied twice by the thread.

3. The improvement defined in claim 1, further comprising the step of pulling said additional loops together.

4. The improvement defined in claim 1 wherein the thread is severed in step (j) at the last one of said additional loops, further comprising the step of automatically pulling the thread through said additional loops prior to the gripping and holding of said thread in step (k).

5. The improvement defined in claim 1 wherein steps (c) through (k) form a closed operating cycle.

6. In a device for tying a bundle of electrical wires, said device comprising a housing, a thread supply wheel mounted to said housing, a substantially horseshoe-shaped guide member with a U-shaped opening pivotable about the bundle of wires upon placement thereof in said opening, loop-forming means including a latch needle mounted to said housing for forming interlocking loops of thread on said bundle, first means on said housing operatively connected to said latch needle for swinging said latch needle about a pivot point so that said needle is located on substantially opposite sides of said bundle in alternating phases of an operating cycle, second means on said housing operatively connected to said latch needle for shifting same in a longitudinal direction in said alternating phases of an operating cycle, third means on said housing operatively coupled to said latch needle and said guide member for rotating same about said bundle in conjunction with the pivoting of said latch needle by said first means, the improvement comprising:

a cutting knife movably mounted to the housing;

shifting means on said housing operatively linked to said knife for shifting said knife in a direction substantially parallel to the orientation of the latch needle in an extended state thereof on one side of the bundle of wires; and gripping means including an intercept needle movably mounted to said housing for grasping and holding a thread upon a severing thereof after a tying operation and a knotting operation, said shifting means being operatively linked to said gripping means for shifting said intercept needle substantially simultaneously with the shifting of said knife.

7. The improvement defined in claim 6 further comprising programmer means operatively coupled to the loop-forming means and to the first means for controlling the operation thereof to limit a tying cycle to a first predetermined plurality of repetitions and to induce the execution by said loop-forming means of a second predetermined plurality of knotting cycles.

8. The improvement defined in claim 7 wherein said programmer means includes at least one cam wheel.

9. The improvement defined in claim 7 wherein said first means includes a wishbone-shaped slot in a plate fastened to said housing and a pin projecting from said latch needle through said slot, said slot having a pair of elongate extensions, said programmer means including a finger member shiftable into proximity with said slot for preventing said pin from moving along one of said extensions upon the completion of said first predetermined plurality of repetitions of said tying cycle and for thereby inducing the execution of said second predetermined plurality of knotting cycles by said loop-forming means.

10. The improvement defined in claim 7 wherein said programmer means cooperates with said shifting means for inducing the operation thereof upon the completion of said predetermined plurality of knotting cycles.

11. The improvement defined in claim 10 wherein said second means includes a first pneumatic cylinder and said shifting means includes a second pneumatic cylinder, said programmer means being operatively linked to said cylinders for contolling the actuation thereof at respective preselected times in a complete operating sequence, said programmer means including a time delay device for ensuring a precise separation between (a) tying and knotting operations performed by said loop-forming means and (b) cutting and thread holding operations performed by said knife and said gripping means.

12. The improvement defined in claim 11 wherein said time delay device is an air damper operatively linked to a piston of said second pneumatic cylinder.

13. The improvement defined in claim 10 wherein said programmer mean includes at least one control cam.

* * * * *